(12) United States Patent
Parikh et al.

(10) Patent No.: US 12,183,631 B2
(45) Date of Patent: Dec. 31, 2024

(54) METHODS FOR COPPER DOPED HYBRID METALLIZATION FOR LINE AND VIA

(71) Applicant: Applied Materials, Inc., Santa Clara, CA (US)

(72) Inventors: Suketu Parikh, San Jose, CA (US); Alexander Jansen, San Jose, CA (US); Joung Joo Lee, San Jose, CA (US); Lequn Liu, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 401 days.

(21) Appl. No.: 17/839,817

(22) Filed: Jun. 14, 2022

(65) Prior Publication Data

US 2023/0005789 A1 Jan. 5, 2023

Related U.S. Application Data

(60) Provisional application No. 63/218,015, filed on Jul. 2, 2021.

(51) Int. Cl.
*H01L 21/768* (2006.01)
*H01L 21/02* (2006.01)
(Continued)

(52) U.S. Cl.
CPC .. *H01L 21/76882* (2013.01); *H01L 21/02063* (2013.01); *H01L 21/31053* (2013.01);
(Continued)

(58) Field of Classification Search
CPC ......... H01L 21/76882; H01L 21/02063; H01L 21/31053; H01L 21/76807;
(Continued)

(56) References Cited

U.S. PATENT DOCUMENTS 6,130,156 A 10/2000 Havemann et al.
9,613,856 B1 * 4/2017 Yang ................. H01L 23/53233
(Continued)

OTHER PUBLICATIONS

PCT International Search Report and Written Opinion for PCT/US2022/035235 dated Oct. 21, 2022.
(Continued)

*Primary Examiner* — David Vu
(74) *Attorney, Agent, or Firm* — MOSER TABOA

(57) ABSTRACT

Methods for forming interconnects on a substrate with low resistivity and high dopant interfaces. In some embodiments, a method includes depositing a first copper layer with a dopant with a first dopant content of 0.5 percent to 10 percent in the interconnect by sputtering a first copper-based target at a first temperature of zero degrees Celsius to 200 degrees Celsius, annealing the substrate at a second temperature of 200 degrees Celsius to 400 degrees Celsius to reflow the first copper layer, depositing a second copper layer with the dopant with a second dopant content of zero percent to 0.5 percent by sputtering a second copper-based target at the first temperature of zero degrees Celsius to 200 degrees Celsius, and annealing the substrate at a third temperature of 200 degrees Celsius to 400 degrees Celsius to reflow the second copper layer.

20 Claims, 5 Drawing Sheets

(51) Int. Cl.
*H01L 21/3105* (2006.01)
*H01L 23/532* (2006.01)

(52) U.S. Cl.
CPC .. *H01L 21/76807* (2013.01); *H01L 21/76814* (2013.01); *H01L 21/7684* (2013.01); *H01L 21/76846* (2013.01); *H01L 23/53238* (2013.01)

(58) Field of Classification Search
CPC .......... H01L 21/76814; H01L 21/7684; H01L 21/76846; H01L 23/53238; H01L 21/76843; H01L 21/76844; H01L 21/76858; H01L 23/53233; H01L 21/67184; H01L 21/2855; H01L 21/28568; H01L 21/3212; H01L 21/32135
See application file for complete search history.

(56) References Cited

U.S. PATENT DOCUMENTS

| | | | |
|---|---|---|---|
| 9,997,457 B2 * | 6/2018 | Jezewski | ............ H01L 29/7848 |
| 10,438,847 B2 | 10/2019 | Lai et al. | |
| 10,818,589 B2 | 10/2020 | Amanapu et al. | |
| 2002/0115292 A1 | 8/2002 | Andricacos et al. | |
| 2006/0027460 A1 | 2/2006 | Chang et al. | |
| 2007/0049017 A1 | 3/2007 | Hsieh | |
| 2007/0054488 A1 | 3/2007 | Ko et al. | |
| 2008/0237859 A1 | 10/2008 | Ishizaka et al. | |
| 2010/0200991 A1 | 8/2010 | Akolkar et al. | |
| 2012/0077053 A1 | 3/2012 | Akolkar et al. | |
| 2016/0056073 A1 | 2/2016 | Collins et al. | |
| 2019/0115254 A1 | 4/2019 | Sheu et al. | |
| 2021/0020569 A1 | 1/2021 | Parikh et al. | |
| 2021/0111067 A1 | 4/2021 | Jiang et al. | |
| 2022/0090283 A1 | 3/2022 | Mevellec et al. | |

OTHER PUBLICATIONS

International Search Report for PCT/US2022/035231, dated Oct. 25, 2022.

Joi et al., Pulse Electrodeposition of Copper-Manganese Alloy for Application in Interconnect Metallization, Journal of The Electrochemical Society, Feb. 2013, 5 pages.

Lee et al., Mechanism and improvements of Cu voids under via bottom, Semiconductor Digest, 2018, 14 pages.

* cited by examiner

METHODS FOR COPPER DOPED HYBRID METALLIZATION FOR LINE AND VIA

CROSS-REFERENCE TO RELATED APPLICATIONS

This application claims benefit of U.S. provisional patent application Ser. No. 63/218,015, filed Jul. 2, 2021, which is herein incorporated by reference.

FIELD

Embodiments of the present principles generally relate to semiconductor processing of semiconductor substrates.

BACKGROUND

Copper is often used in semiconductor connectivity as a low resistance material for metallization processes. However, as the critical dimensions become smaller, electrical pathways such as vias have been failing due to copper voids occurring at the interfaces. The copper voids cause high resistance and even complete failure of the vias, decreasing the wafer yields. Some processes attempting to resolve the issues have reduced the number of voids but at the expense of a higher resistance in the interconnects.

Accordingly, the inventors have provided improved processes that improve the performances of vias while maintaining lower resistivity in dual damascene interconnects.

SUMMARY

Methods for improving copper interface quality while minimizing resistivity are provided herein.

In some embodiments, a method of forming an interconnect may comprise depositing a first copper layer with a dopant with a first dopant content on a feature on a substrate by sputtering a first copper-based target at a first temperature, annealing the substrate at a second temperature to reflow the first copper layer on the substrate to migrate the dopant in the first copper layer towards a dielectric interface, depositing a second copper layer with the dopant with a second dopant content by sputtering a second copper-based target at the first temperature, where the second dopant content is less than the first dopant content, and annealing the substrate at a third temperature to reflow the second copper layer on the substrate to fill the feature and form at least a portion of the interconnect, where the third temperature is less than or equal to the second temperature.

In some embodiments, the method may further include where the first dopant content is approximately 0.5 percent to approximately 10 percent or where the second dopant content is zero percent to approximately 0.5 percent, where the first temperature is zero degrees Celsius to approximately 200 degrees Celsius, where the second temperature is approximately 200 degrees Celsius to approximately 400 degrees Celsius, or where the third temperature is approximately 200 degrees Celsius to approximately 400 degrees Celsius, where the dopant is manganese, magnesium, cobalt, graphene, or aluminum, prior to deposition of the first copper layer: etching an etch stop layer in a bottom of a via to expose a portion of an underlying metallic layer, degassing and precleaning the substrate on the substrate, selectively depositing a barrier layer on sidewalls of the via in interconnect structures, and conformally depositing a liner layer on the portion of the underlying metallic layer on the bottom of the via and on the barrier layer on the sidewalls of the via in the interconnect structures, where the method is performed without a vacuum break, where the barrier layer is formed from tantalum nitride and the liner layer is formed from cobalt or ruthenium, where the substrate is lifted above a pedestal to decrease the third temperature to a value less than the second temperature when annealing the second copper layer to make the second copper layer graded, etching back a portion of the first copper layer with a dry SiOC etch after annealing and prior to depositing the second copper layer to form the second copper layer with a greater cross-section for reduced interconnect resistivity, performing a chemical mechanical polishing process on the substrate after deposition and annealing of the second copper layer, where the depositing of the first copper layer and the annealing of the substrate at the second temperature is a first cyclic process that is performed more than once or where the depositing of the second copper layer and the annealing of the substrate at the third temperature is a second cyclic process that is performed more than once, directionally depositing the first copper layer with the dopant with the first dopant content on the substrate, where the feature is at least one damascene structure including at least one via and at least one trench and annealing the substrate at a second temperature to reflow the first copper layer on the substrate to migrate the dopant in the first copper layer towards the dielectric interface, where the at least one via of the damascene structure is completely filled and the at least one trench on the substrate has a portion of the first copper layer on at least one sidewall, and/or where the first dopant content is approximately 0.5 percent to approximately 10 percent and where the second dopant content is zero percent to approximately 0.5 percent.

In some embodiments, a method of forming an interconnect may comprise depositing a first copper layer with a dopant with a first dopant content on at least one trench on a substrate by sputtering a first copper-based target at a first temperature, annealing the substrate at a second temperature to migrate the dopant in the first copper layer to a sidewall of the at least one trench and to migrate the dopant in the first copper layer into a barrier layer of the at least one trench, depositing a second copper layer with the dopant with a second dopant content on the at least one trench by sputtering a second copper-based target at the first temperature, where the second dopant content is less than the first dopant content, and annealing the substrate at a third temperature to reflow the second copper layer on the substrate to fill the at least one trench, where the third temperature is less than or equal to the second temperature.

In some embodiments, the method may further include where the first dopant content is approximately 0.5 percent to approximately 10 percent and where the second dopant content is zero percent to approximately 0.5 percent, and/or where the first temperature is zero degrees Celsius to approximately 200 degrees Celsius, where the second temperature is approximately 200 degrees Celsius to approximately 400 degrees Celsius, and where the third temperature is approximately 200 degrees Celsius to approximately 400 degrees Celsius.

In some embodiments, a method of forming an interconnect may comprise depositing a metal layer on at least one trench on a substrate by sputtering a metal-based target at a first temperature, annealing the substrate at a second temperature to reflow the metal layer in the at least one trench and fill at least one via in the at least one trench to improve electro migration of the at least one via and sidewalls of the at least one trench, etching back the metal layer on the sidewalls of the at least one trench with an isotropic metal etch to allow for additional bulk fill to reduce resistivity of the at least one trench, depositing a copper layer with a dopant with a dopant content on the at least one trench by sputtering a copper-based target at the first temperature, and annealing the substrate at a third temperature to reflow the copper layer on the substrate to fill the at least one trench, where the third temperature is less than or equal to the second temperature.

In some embodiments, the method may further include where the isotropic metal etch uses nitrogen trifluoride gas with oxygen gas or chlorine gas with oxygen gas to etch the metal layer, where the metal layer is cobalt, ruthenium, tungsten, molybdenum, or copper alloy with a dopant of manganese or where the dopant content is zero percent to approximately 0.5 percent, and/or where the first temperature is zero degrees Celsius to approximately 200 degrees Celsius, where the second temperature is approximately 200 degrees Celsius to approximately 400 degrees Celsius, and where the third temperature is approximately 200 degrees Celsius to approximately 400 degrees Celsius.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

Figure 1:
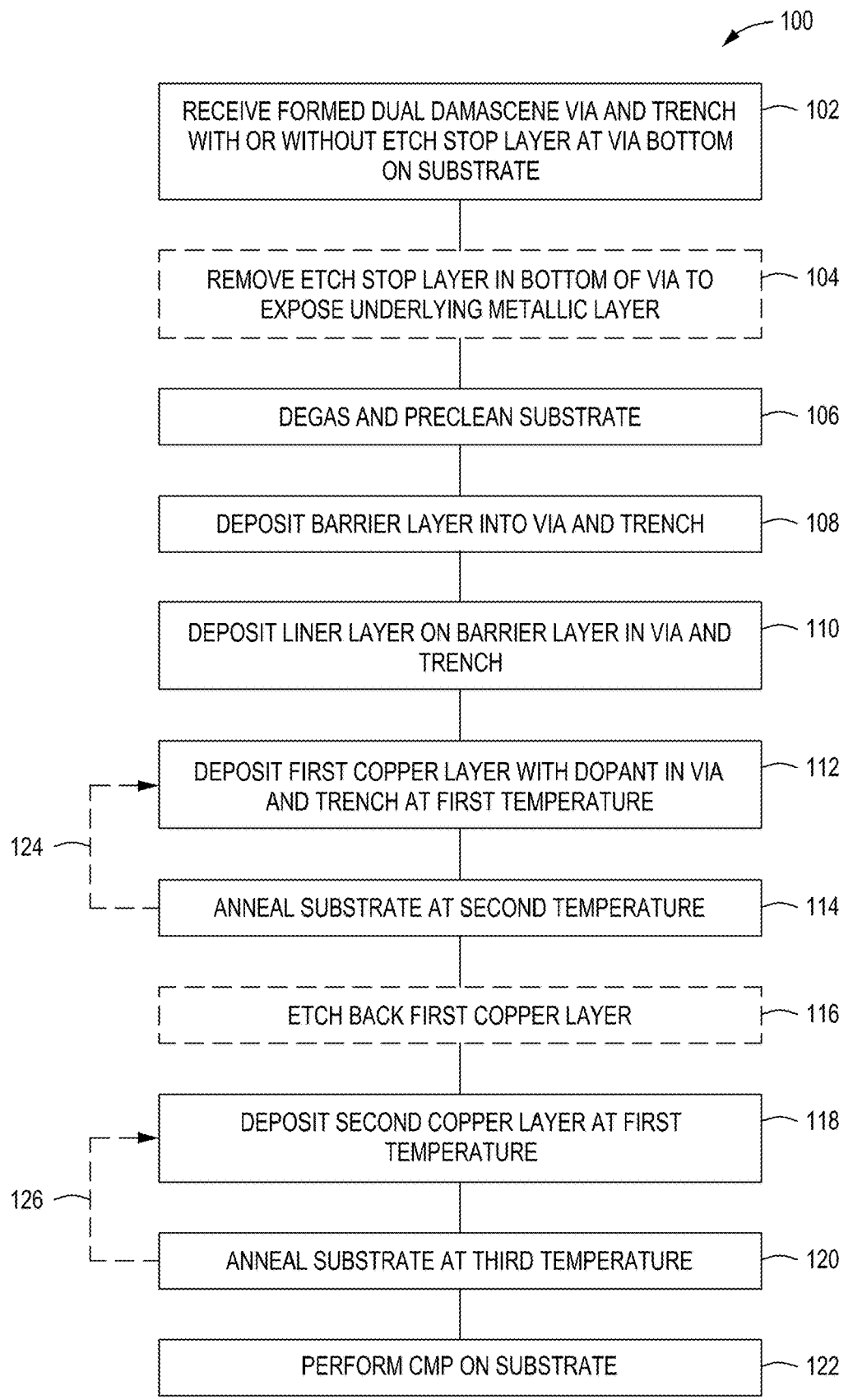
FIG. 1 a method of dual metallization for via and line on a substrate in accordance with some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods provide a high-quality copper interface with low resistivity in vias and line interconnects. The methods use an integrated tool to first deposit a copper doped with high dopant such as, but not limited to, manganese (Mn), aluminum (Al), graphene, or magnesium (Mg), which keeps the highly doped copper at the via and trench interfaces (barrier interfaces). A slight anneal and reflow process moves the dopant towards the interface of the dielectric and barrier layer, improving the barrier layer and electro migration (EM) properties. A second process of reflow fills the vias and trenches with pure or low doped copper for the bulk or center of trenches, resulting in low resistivity. The methods and apparatus of the present principles have the advantages of improved line EM and TDDB (time dependent dielectric breakdown) with increased dopant at the interfaces, improved via EM which allows scaling of dual damascene to sub 30 nm pitch, high dopant in via and trench sidewalls which allows, for example Ta—Mn O—N formation, to enhance barrier properties, scaling of barrier layer thickness (dead area) with dopant protection, and reduced line resistivity as the dopant in trench bulk areas is kept low.

Scaling the liner and barrier layers for advanced interconnects is difficult as the scaling causes issues with gapfill, electro migration, and TDDB. Current densities within vias are also significantly higher which leads to copper voids and open circuits. The bottom of the via is the weakest link (due to uneven grains and lower activation energy (Ea)) for copper diffusion and potential micro voids during gapfill processes. The traditional processes use pure copper fill or copper alloy with same amount of dopant throughout. Thus, higher dopant content is required to get the same EM and barrier performance, resulting in higher resistivity. The inventors have discovered that by creating a two-part copper process having a dopant such as Mn in the first 30 A to 70 A, the process can allow for improved dopant at the interface and via bottom, improving EM and barrier properties. Subsequently deposited pure copper (or lower dopant copper) allows for low resistivity in the rest of the interconnect (e.g., trenches).

Figure 2A:
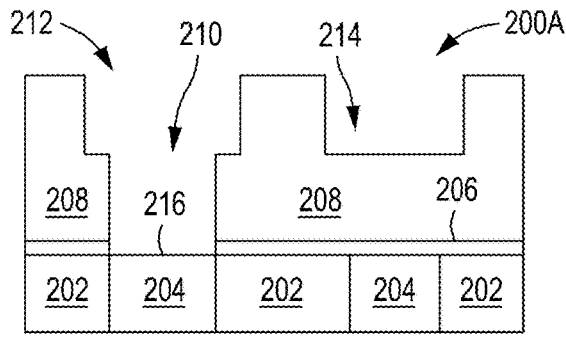
FIG. 2A depicts a cross-sectional view of a dual damascene via and line without an etch stop layer in a bottom of the via in accordance with some embodiments of the present principles.
Figure 2B:
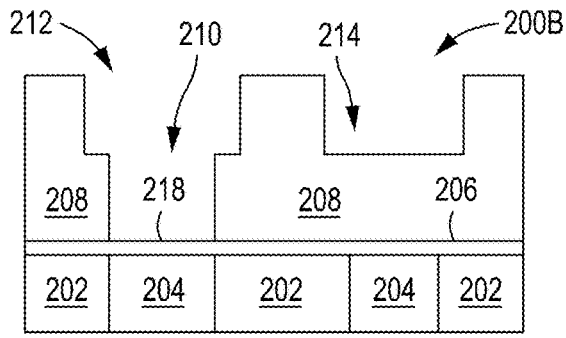
FIG. 2B depicts a cross-sectional view of a dual damascene via and line with an etch stop layer present in a bottom of the via in accordance with some embodiments of the present principles.

As used herein, a feature on a substrate may include an interconnect structure, a trench structure, a damascene structure, a via structure (e.g., a dual damascene via, etc.) and the like. Different types of features may be used as examples in some embodiments but are not meant to be limiting to only that feature type. FIG. 1 is a method 100 of dual metallization for dual damascene via and trench structures on a substrate in accordance with some embodiments. The method 100 may be performed in an integrated tool (e.g., integrated tool 400 of FIG. 4) without a vacuum break between processes, ensuring high quality interfaces. The method 100 is described with reference to FIGS. 2A-2J. In block 102, a substrate is received with at least one dual damascene via and trench formed on the substrate. The via may or may not have an etch stop layer at the bottom of the via. As depicted in a view 200A of FIG. 2A, the substrate has a first dielectric layer 202 with metallic material 204 underlying an etch stop layer 206. A second dielectric layer 208 has been formed on the etch stop layer 206. A via 210 and a first trench 212 have been formed in a dual damascene process along with a second trench 214. In FIG. 2A, the portion of the etch stop layer at the bottom 216 of the via has been removed, exposing the underlying portion of the metallic material 204. The exposed portion of the metallic material 204 will immediately begin corroding and oxidizing when exposed to air/moisture. The substrate must then be subsequently transferred and processed within a certain time period or queue time limit, or the substrate may be too damaged to process. The queue time is the amount of time that hydrogen passivated wafers can be exposed to air (moisture) before requiring to be in an inert environment for further processing. The inventors have found that the queue time may be eliminated by receiving the substrate with the etch stop layer 206 remaining intact in the bottom 218 of the via 210 as depicted in a view 200B of FIG. 2B. The queue time is eliminated because the underlying metallization material 204 remains protected from corrosion and oxidation by the etch stop layer 206, saving processing time, increasing yield, and allowing the wafers to be processed whenever equipment becomes available.

Figure 2C:
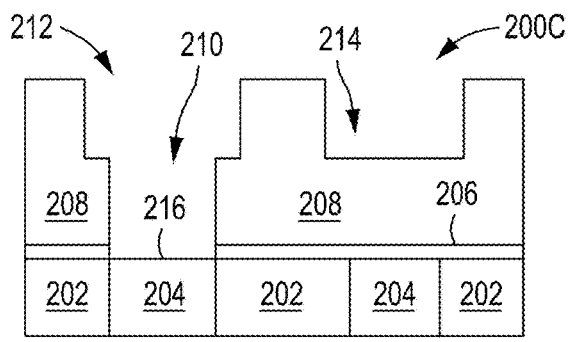
FIG. 2C depicts a cross-sectional view of a dual damascene via and line with an etch stop layer removed from a bottom of the via in accordance with some embodiments of the present principles.
Figure 2D:
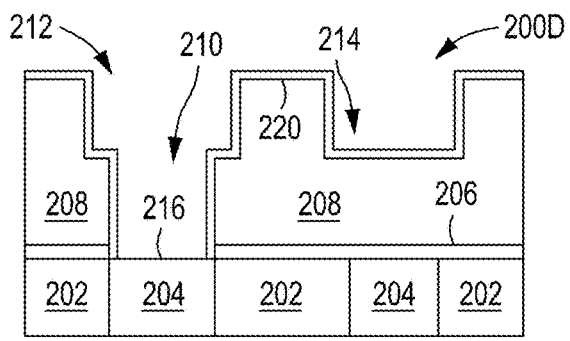
FIG. 2D depicts a cross-sectional view of a dual damascene via and line after deposition of a barrier layer in accordance with some embodiments of the present principles.

If the received substrate has an etch stop layer 206 that is intact in the bottom of the via 210, the optional process in block 104 is performed to remove the etch stop layer in the bottom of the via to expose the underlying metallic layer 204 as depicted in a view 200C of FIG. 2C. The etch stop layer 206 may be opened using a dry directional etch with nitrogen trifluoride (NF$_3$) radicals or boron trichloride (BCl$_3$) radicals, and the like. After the etching process is completed, the substrate is transferred in vacuum to the next process to prevent any corrosion or oxidation on the exposed metallic material 204, decreasing the interface resistance of the via 210 and the metallic material 204. In block 106, the substrate is degassed and precleaned as necessary. In block 108, a barrier layer 220 is deposited by selective deposition or reverse selective deposition on the substrate in the via 210, the first trench 212, and the second trench 214 as depicted in a view 200D of FIG. 2D. The bottom 216 of the via 210 is not coated with the barrier layer 220 as part of the selective/reverse selective deposition process. The barrier layer 220 may be a tantalum nitride (TaN) material or a titanium nitride (TiN) material and the like.

Figure 2E:
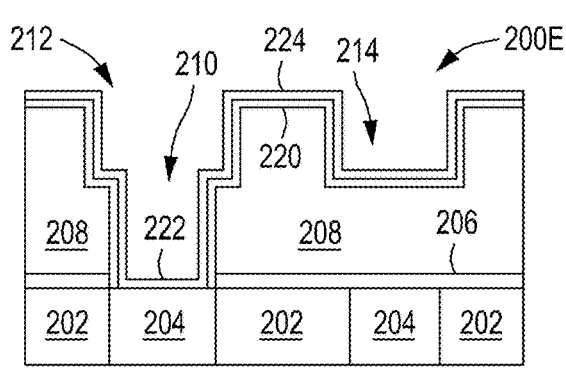
FIG. 2E depicts a cross-sectional view of a dual damascene via and line after deposition of a liner layer on the barrier layer in accordance with some embodiments of the present principles.
Figure 2F:
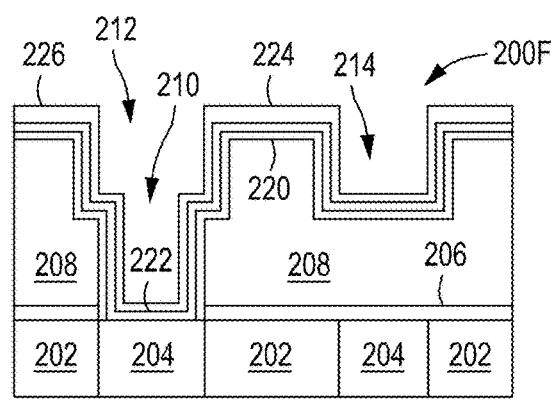
FIG. 2F depicts a cross-sectional view of a dual damascene via and line after deposition and anneal of a first copper layer with dopant in accordance with some embodiments of the present principles.
Figure 2G:
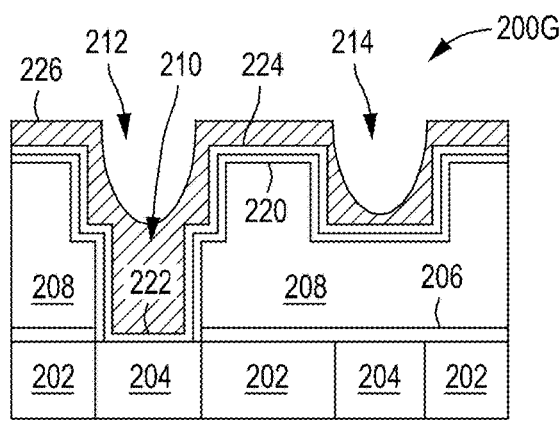
FIG. 2G depicts a cross-sectional view of a dual damascene via and line after deposition and anneal of a first copper layer with dopant in accordance with some embodiments of the present principles.

In block 110, a liner layer 224 is deposited on the substrate in the via 210, the first trench 212, and the second trench 214 as depicted in a view 200E of FIG. 2E. The liner layer 224 is deposited on the bottom 222 of the via 210 on the metallic material 204. The liner layer 224 may be a material such as, but not limited to, cobalt or ruthenium and may include multiple layers. In block 112, a first copper layer 226 is deposited by directional sputtering on the substrate in the via 210, the first trench 212, and the second trench 214 at a first temperature as depicted in a view 200F of FIG. 2F. The first copper layer 226 is doped with a dopant such as, but not limited to, Mn, Al, graphene, Co, or Mg, and the like. The first copper layer 226 is doped with a high concentration of dopant ranging from approximately 0.5% to approximately 10%. The thickness of the first copper layer 226 may range from approximately 20 angstroms to approximately 100 angstroms when deposited. Horizontal surfaces within the via and trenches tend to be thicker than the sidewalls of the via and trenches. The first temperature during deposition of the first copper layer 226 is a low temperature which may range from zero degrees Celsius to approximately 200 degrees Celsius.

In block 114, the substrate is annealed at a second temperature to cause reflow of the first copper layer 226 and migration of the dopant towards the barrier layer 220 and interface, increasing the TDDB performance of the barrier for the trenches and vias. The migration strengthens the barrier allowing a reduced barrier thickness to be used without sacrificing barrier performance. The annealing also reflows the first copper layer 226 into the via 210 and fills the via 210 (see view 200G of FIG. 2G) with the doped first copper layer material, improving the via electro migration performance significantly over copper material alone. The second temperature is a high temperature which may range from approximately 200 degrees Celsius to approximately 400 degrees Celsius. The deposition and annealing of the first copper layer 226 may be a cyclic process that is performed more than once as indicated at 124 of the method 100. Each time the first copper layer 226 is deposited and annealed, more of the dopant migrates to the barrier, increasing TDDB performance of the barrier layer 220 and interface, and more of the first copper layer material fills the via 210, increasing electro migration performance of the via 210.

Figure 2H:
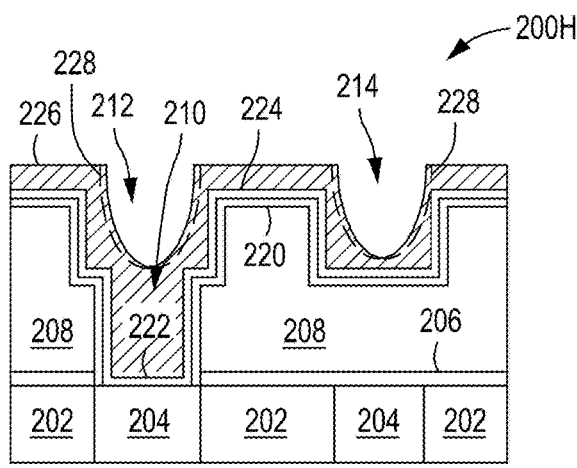
FIG. 2H depicts a cross-sectional view of a dual damascene via and line indicating an optional etch back of the first copper layer after deposition and anneal in accordance with some embodiments of the present principles.

After completion of the deposition and anneal processes of the first copper layer 226, optional block 116 may be performed to etch back a portion of the first copper layer 226 as depicted in a view 200H of FIG. 2H. A dashed line 228 indicates an example etch back in the first trench 212 and the second trench 214. The etch back process is not intended to diminish the first copper layer material in the via 210, but to widen the first trench 212 and the second trench 214 to allow more room for a subsequent deposition (increased gapfill to reduce resistance) by thinning the trench sidewalls of material of the first copper layer 226. In block 118, a second copper layer 230 is deposited by sputtering at the first temperature on the substrate. The second copper layer 230 may be doped with a dopant such as, but not limited to, Mn, Al, graphene, Co, or Mg, and the like. The second copper layer 230 is either not doped or has a low concentration of dopant ranging from greater than zero percent to approximately 0.5 percent. The first temperature during deposition of the second copper layer 230 is a low temperature which may range from zero degrees Celsius to approximately 200 degrees Celsius.

Figure 2I:
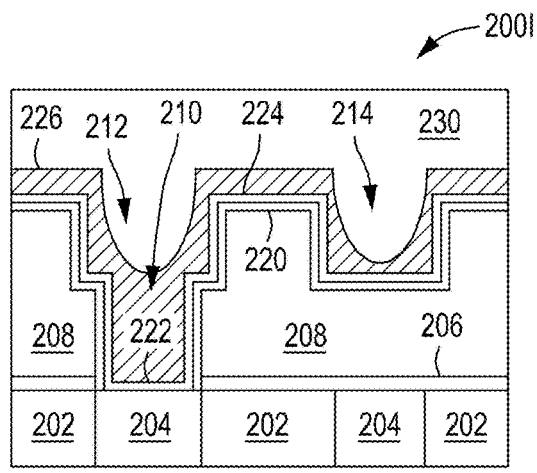
FIG. 2I depicts a cross-sectional view of a dual damascene via and line after a deposition and anneal of a second copper layer in accordance with some embodiments of the present principles.
Figure 2J:
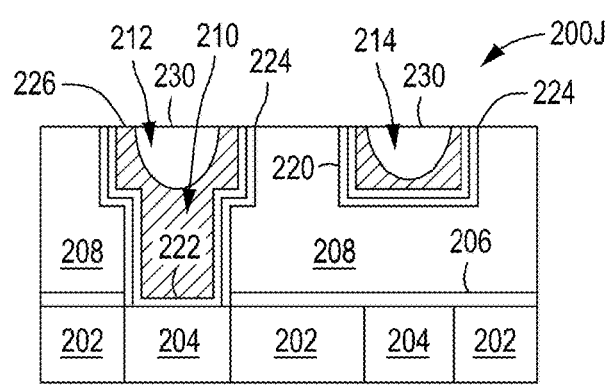
FIG. 2J depicts a cross-sectional view of a dual damascene via and line after a chemical mechanical process in accordance with some embodiments of the present principles.

In block 120, the substrate is annealed at a third temperature to cause reflow of the second copper layer 230 and filling the first trench 212 and the second trench 214 as depicted in a view 200I of FIG. 2I. The third temperature is a high temperature which may range from approximately 200 degrees Celsius to approximately 400 degrees Celsius. In some embodiments, the third temperature may be less than the second temperature. The deposition and annealing of the second copper layer 230 may be a cyclic process that is performed more than once as indicated at 126 of the method 100. The high dopant concentration in the first copper layer 226 increases performance of the via by increasing the via's electro migration performance while also increasing the TDDB performance of the barrier layer 220 and interface. If the same high dopant concentration were used in the second copper layer 230, the resistance of the first trench 212 and the second trench 214 would be substantially increased. By using no dopant or low dopant in the second copper layer 230, the resistance of the first trench 212 and the second trench 214 is kept low. The intervening annealing processes of the first copper layer 226 and the second copper layer 230 help to increase performance while ensuring that voids are filled. After the deposition and anneal processes of the second copper layer 230 have completed, in block 122, a chemical mechanical polishing (CMP) process is performed on the substrate to remove overburden as depicted in a view 200J of FIG. 2J. The CMP process removes the extra material from the top surface of the substrate to allow for subsequent processing.

Figure 3:
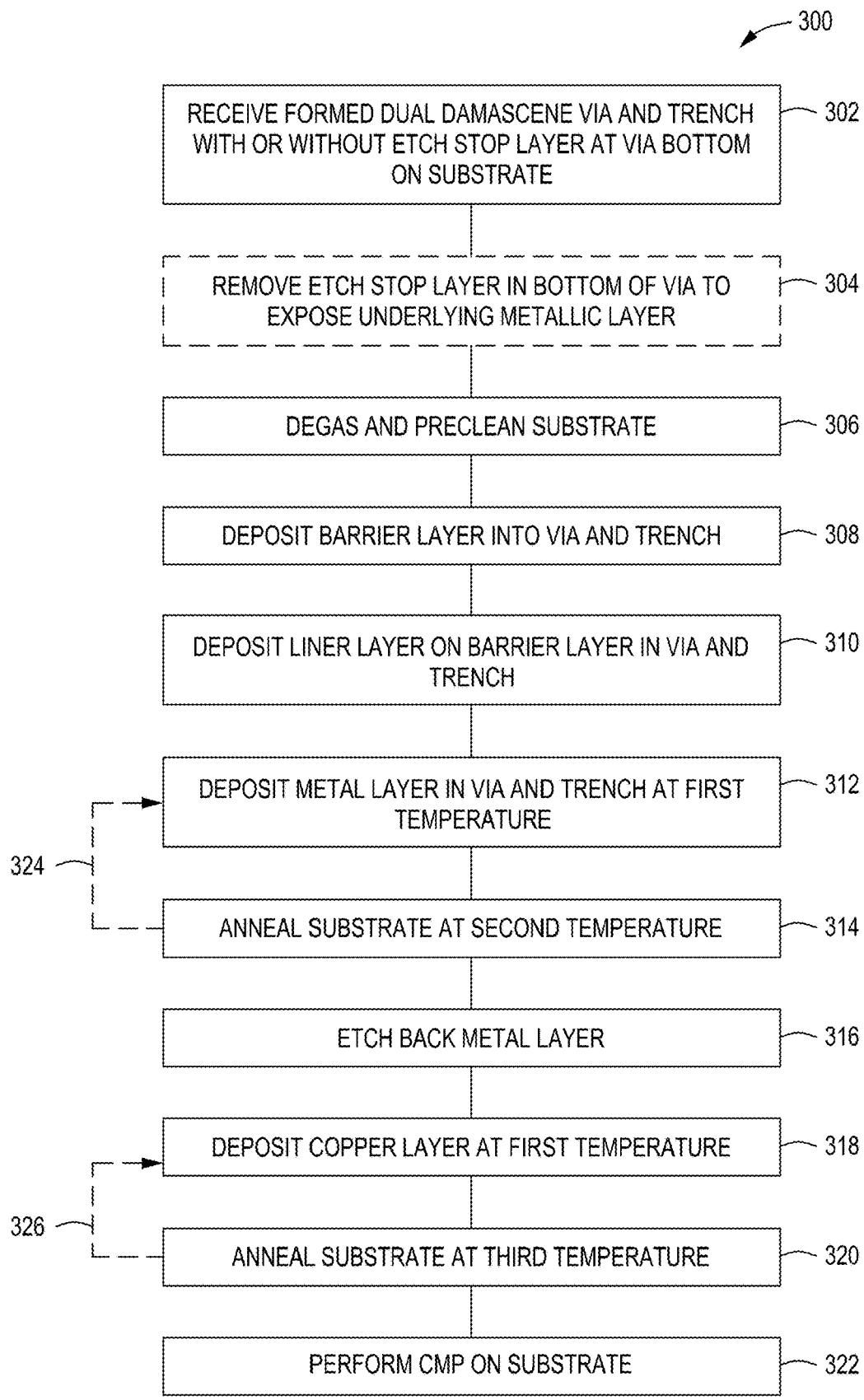
FIG. 3 is a method of dual metallization for via and line on a substrate in accordance with some embodiments of the present principles.

FIG. 3 is a method 300 of dual metallization for dual damascene via and trench structures on a substrate in accordance with some embodiments. The method 300 may be performed in an integrated tool (e.g., integrated tool 400 of FIG. 4) without a vacuum break between processes, ensuring high quality interfaces. The method 300 is described with reference to FIGS. 2A-2J. In block 302, a substrate is received with at least one dual damascene via and trench formed on the substrate. The via may or may not have an etch stop layer at the bottom of the via. As depicted in a view 200A of FIG. 2A, the substrate has a first dielectric layer 202 with metallic material 204 underlying an etch stop layer 206. A second dielectric layer 208 has been formed on the etch stop layer 206. A via 210 and a first trench 212 have been formed in a dual damascene process along with a second trench 214. In FIG. 2A, the portion of the etch stop layer at the bottom 216 of the via has been removed, exposing the underlying portion of the metallic material 204. The exposed portion of the metallic material 204 will immediately begin corroding and oxidizing when exposed to air/moisture. The substrate must then be subsequently transferred and processed within a certain time period or queue time limit or the substrate may be too damaged to process. The queue time is the amount of time that hydrogen passivated wafers can be exposed to air (moisture) before requiring to be in an inert environment for further processing. The inventors have found that the queue time may be eliminated by receiving the substrate with the etch stop layer 206 remaining intact in the bottom 218 of the via 210 as depicted in a view 200B of FIG. 2B. The queue time is eliminated because the underlying metallization material 204 remains protected from corrosion and oxidation by the etch stop layer 206, saving processing time, increasing yield, and allowing the wafers to be processed whenever equipment becomes available.

If the received substrate has an etch stop layer 206 that is intact in the bottom of the via 210, the optional process in block 304 is performed to remove the etch stop layer in the bottom of the via to expose the underlying metallic layer 204 as depicted in a view 200C of FIG. 2C. The etch stop layer 206 may be opened using a dry directional etch with nitrogen trifluoride ($NF_3$) radicals or boron trichloride ($BCl_3$) radicals, and the like. After the etching process is completed, the substrate is transferred in vacuum to the next process to prevent any corrosion or oxidation on the exposed metallic material 204, decreasing the interface resistance of the via 210 and the metallic material 204. In block 306, the substrate is degassed and precleaned as necessary. In block 308, a barrier layer 220 is deposited by selective deposition or reverse selective deposition on the substrate in the via 210, the first trench 212, and the second trench 214 as depicted in a view 200D of FIG. 2D. The bottom 216 of the via 210 is not coated with the barrier layer 220 as part of the selective/reverse selective deposition process. The barrier layer 220 may be a tantalum nitride (TaN) material or a titanium nitride (TiN) material and the like.

In block 310, a liner layer 224 is deposited on the substrate in the via 210, the first trench 212, and the second trench 214 as depicted in a view 200E of FIG. 2E. The liner layer 224 is deposited on the bottom 222 of the via 210 on the metallic material 204. The liner layer 224 may be a material such as, but not limited to, cobalt or ruthenium and may include multiple layers. In block 312, a metal layer (similar to a first copper layer 226) is deposited by chemical vapor deposition or atomic layer deposition on the substrate in the via 210, the first trench 212, and the second trench 214 at a first temperature as depicted in a view 200F of FIG. 2F. The metal layer may be cobalt, ruthenium molybdenum, tungsten, or copper-based alloy with dopant (e.g., dopants as found in method 100 for the first copper layer 226). The thickness of the metal layer may range from approximately 20 angstroms to approximately 300 angstroms when deposited. Horizontal surfaces within the via and trenches tend to be thicker than the sidewalls of the via and trenches. The first temperature during deposition of the first copper layer 226 is a low temperature which may range from zero degrees Celsius to approximately 200 degrees Celsius.

In block 314, the substrate is annealed at a second temperature to cause reflow of the metal layer. The annealing reflows the metal layer on the sidewalls of the trenches to improve electro migration in the sidewalls and into the via 210, filling the via 210 (see view 200G of FIG. 2G) with the metal layer material and improving the via electro migration performance as well. The second temperature is a high temperature which may range from approximately 200 degrees Celsius to approximately 400 degrees Celsius. The deposition and annealing of the metal layer may be a cyclic process that is performed more than once as indicated at 324 of the method 300. Each time the metal layer more of the metal layer material fills the via 210, increasing electro migration performance of the via 210.

After completion of the deposition and anneal processes of the metal layer, block 316 is performed to etch back a portion of the metal layer (see, e.g., view 200H of FIG. 2H and first copper layer 226). The etching process may be an isotropic metal etch using nitrogen trifluoride gas with oxygen gas or chlorine gas with oxygen gas to etch the metal layer. A dashed line 228 indicates an example etch back in the first trench 212 and the second trench 214. The etch back process is not intended to diminish the metal layer material in the via 210, but to widen the first trench 212 and the second trench 214 to allow more room for a subsequent deposition (increased gapfill to reduce resistance) by thinning the trench sidewalls of material of the metal layer. In block 318, a copper layer (similar to the second copper layer 230) is deposited by sputtering at the first temperature on the substrate. The copper layer may be doped with a dopant such as, but not limited to, Mn, Al, graphene, Co, or Mg, and the like. The copper layer is either not doped or has a low concentration of dopant ranging from greater than zero percent to approximately 0.5 percent. The first temperature during deposition of the copper layer is a low temperature which may range from zero degrees Celsius to approximately 200 degrees Celsius.

In block 320, the substrate is annealed at a third temperature to cause reflow of the copper layer and filling the first trench 212 and the second trench 214 as depicted in a view 200I of FIG. 2I. The third temperature is a high temperature which may range from approximately 200 degrees Celsius to approximately 400 degrees Celsius. In some embodiments, the third temperature may be less than the second temperature. The deposition and annealing of the copper layer may be a cyclic process that is performed more than once as indicated at 326 of the method 300. If a high dopant concentration were used in the copper layer, the resistance of the first trench 212 and the second trench 214 would be substantially increased. By using no dopant or low dopant in the copper layer, the resistance of the first trench 212 and the second trench 214 is kept low. The intervening annealing processes of the metal layer and the copper layer help to increase performance while ensuring that voids are filled. After the deposition and anneal processes of the copper layer have completed, in block 322, a chemical mechanical polishing (CMP) process is performed on the substrate to remove overburden as depicted in a view 200J of FIG. 2J. The CMP process removes the extra material from the top surface of the substrate to allow for subsequent processing.

Figure 4:
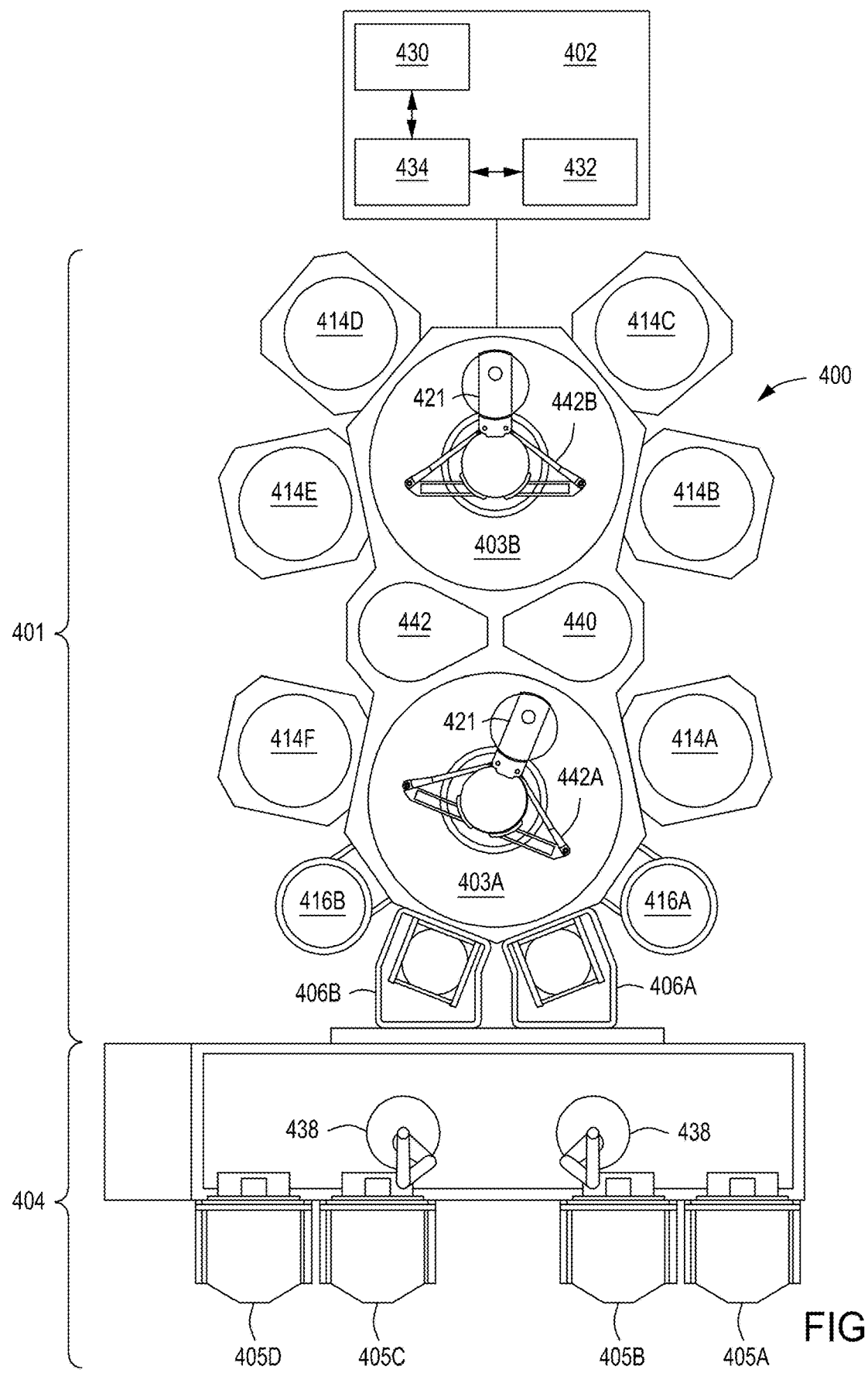
FIG. 4 depicts a top-down view of an integrated tool configured to perform operations on a dual damascene via and line in accordance with some embodiments of the present principles.

The methods for creating dual metal interconnects described herein may be performed in individual process chambers that may be provided in a standalone configuration or as part of a cluster tool, for example, an integrated tool 400 (i.e., cluster tool) described below with respect to FIG. 4. The advantage of using an integrated tool 400 is that there is no vacuum break and, therefore, no requirement to degas and pre-clean a substrate before treatment. In some embodiments, the methods discussed above may advantageously be performed in an integrated tool such that there are limited or no vacuum breaks between processes. For example, reduced vacuum breaks may limit or prevent contamination of the substrate such as after removing portions of an etch stop layer in a bottom of a via. If the etch stop layer is removed in the integrated tool instead of prior to receipt of the substrate by the integrated tool, the queue time can be eliminated as well as any cleaning and preparation needed to remove corrosion or oxide on the via bottom. The integrated tool 400 includes a processing platform 401 that is vacuum-tight, a factory interface 404, and a system controller 402. The processing platform 401 comprises multiple processing chambers, such as 414A, 414B, 414C, 414D, 414E, and 414F operatively coupled to a vacuum substrate transfer chamber (transfer chambers 403A, 403B). The factory interface 404 is operatively coupled to the transfer chamber 403A by one or more load lock chambers (two load lock chambers, such as 406A and 406B shown in FIG. 4).

In some embodiments, the factory interface 404 comprises at least one docking station 407, at least one factory interface robot 438 to facilitate the transfer of the semiconductor substrates. The docking station 407 is configured to accept one or more front opening unified pod (FOUP). Four FOUPS, such as 405A, 405B, 405C, and 405D are shown in the embodiment of FIG. 4. The factory interface robot 438 is configured to transfer the substrates from the factory interface 404 to the processing platform 401 through the load lock chambers, such as 406A and 406B. Each of the load lock chambers 406A and 406B have a first port coupled to the factory interface 404 and a second port coupled to the transfer chamber 403A. The load lock chamber 406A and 406B are coupled to a pressure control system (not shown) which pumps down and vents the load lock chambers 406A and 406B to facilitate passing the substrates between the vacuum environment of the transfer chamber 403A and the substantially ambient (e.g., atmospheric) environment of the factory interface 404. The transfer chambers 403A, 403B have vacuum robots 442A, 442B disposed in the respective transfer chambers 403A, 403B. The vacuum robot 442A is capable of transferring substrates 421 between the load lock chamber 406A, 406B, the processing chambers 414A and 414F and a cooldown station 440 or a pre-clean station 442. The vacuum robot 442B is capable of transferring substrates 421 between the cooldown station 440 or pre-clean station 442 and the processing chambers 414B, 414C, 414D, and 414E.

In some embodiments, the processing chambers 414A, 414B, 414C, 414D, 414E, and 414F are coupled to the transfer chambers 403A, 403B. The processing chambers 414A, 414B, 414C, 414D, 414E, and 414F comprise at least a first etch chamber configured to dry etch and remove etch stop layers in vias, a first deposition chamber configured to deposit a barrier layer on a substrate, a second deposition chamber configured to deposit a liner layer on the substrate, a third deposition chamber configured to deposit a first copper layer with a dopant of approximately 0.5 percent to approximately 10 percent at first temperature and to reflow the first copper layer at a second temperature, a fourth deposition chamber configured to deposit a second copper layer with a dopant of zero percent to approximately 0.5 percent at a third temperature and to reflow the second copper layer at a fourth temperature, and a second etch chamber configured to etch a portion of the first copper layer after an annealing process. Additional chambers may also be provided such as chemical vapor deposition (CVD) chambers, annealing chambers, atomic layer deposition (ALD) chambers, plasma vapor deposition (PVD) chambers, or the like. ALD and PVD chambers may include any chambers suitable to perform all or portions of the methods described herein, as discussed above. In some embodiments, one or more optional service chambers (shown as 416A and 416B) may be coupled to the transfer chamber 403A. The service chambers 416A and 416B may be configured to perform other substrate processes, such as degassing, orientation, substrate metrology, cool down and the like.

The system controller 402 controls the operation of the integrated tool 400 using a direct control of the process chambers 414A, 414B, 414C, 414D, 414E, and 414F or alternatively, by controlling the computers (or controllers) associated with the process chambers 414A, 414B, 414C, 414D, 414E, and 414F and the integrated tool 400. In operation, the system controller 402 enables data collection and feedback from the respective chambers and systems to optimize performance of the integrated tool 400. The system controller 402 generally includes a Central Processing Unit (CPU) 430, a memory 434, and a support circuit 432. The CPU 430 may be any form of a general-purpose computer processor that can be used in an industrial setting. The support circuit 432 is conventionally coupled to the CPU 430 and may comprise a cache, clock circuits, input/output subsystems, power supplies, and the like. Software routines, such as a method as described above may be stored in the memory 434 and, when executed by the CPU 430, transform the CPU 430 into a specific purpose computer (system controller 402). The software routines may also be stored and/or executed by a second controller (not shown) that is located remotely from the integrated tool 400.

The memory 434 is in the form of computer-readable storage media that contains instructions, when executed by the CPU 430, to facilitate the operation of the semiconductor processes and equipment. The instructions in the memory 434 are in the form of a program product such as a program that implements the method of the present principles. The program code may conform to any one of a number of different programming languages. In one example, the disclosure may be implemented as a program product stored on a computer-readable storage media for use with a computer system. The program(s) of the program product define functions of the aspects (including the methods described herein). Illustrative computer-readable storage media include, but are not limited to: non-writable storage media (e.g., read-only memory devices within a computer such as CD-ROM disks readable by a CD-ROM drive, flash memory, ROM chips, or any type of solid-state non-volatile semiconductor memory) on which information is permanently stored; and writable storage media (e.g., floppy disks within a diskette drive or hard-disk drive or any type of solid-state random access semiconductor memory) on which alterable information is stored. Such computer-readable storage media, when carrying computer-readable instructions that direct the functions of the methods described herein, are aspects of the present principles.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:

1. A method of forming an interconnect, comprising:
depositing a first copper layer with a dopant with a first dopant content on a feature on a substrate by sputtering a first copper-based target at a first temperature;
annealing the substrate at a second temperature to reflow the first copper layer on the substrate to migrate the dopant in the first copper layer towards a dielectric interface;
depositing a second copper layer with the dopant with a second dopant content by sputtering a second copper-based target at the first temperature, wherein the second dopant content is less than the first dopant content; and
annealing the substrate at a third temperature to reflow the second copper layer on the substrate to fill the feature and form at least a portion of the interconnect, wherein the third temperature is less than or equal to the second temperature.

2. The method of claim 1, wherein the first dopant content is approximately 0.5 percent to approximately 10 percent or wherein the second dopant content is zero percent to approximately 0.5 percent.

3. The method of claim 1, wherein the first temperature is zero degrees Celsius to approximately 200 degrees Celsius, wherein the second temperature is approximately 200 degrees Celsius to approximately 400 degrees Celsius, or wherein the third temperature is approximately 200 degrees Celsius to approximately 400 degrees Celsius.

4. The method of claim 1, wherein the dopant is manganese, magnesium, cobalt, graphene, or aluminum.

5. The method of claim 1, further comprising:
prior to deposition of the first copper layer:
etching an etch stop layer in a bottom of a via to expose a portion of an underlying metallic layer;
degassing and precleaning the substrate on the substrate;
selectively depositing a barrier layer on sidewalls of the via in interconnect structures; and
conformally depositing a liner layer on the portion of the underlying metallic layer on the bottom of the via and on the barrier layer on the sidewalls of the via in the interconnect structures.

6. The method of claim 5 performed without a vacuum break.

7. The method of claim 5, wherein the barrier layer is formed from tantalum nitride and the liner layer is formed from cobalt or ruthenium.

8. The method of claim 1, wherein the substrate is lifted above a pedestal to decrease the third temperature to a value less than the second temperature when annealing the second copper layer to make the second copper layer graded.

9. The method of claim 1, further comprising:
etching back a portion of the first copper layer with a dry SiOC etch after annealing and prior to depositing the second copper layer to form the second copper layer with a greater cross-section for reduced interconnect resistivity.

10. The method of claim 1, further comprising:
performing a chemical mechanical polishing process on the substrate after deposition and annealing of the second copper layer.

11. The method of claim 1, wherein the depositing of the first copper layer and the annealing of the substrate at the second temperature is a first cyclic process that is performed more than once or wherein the depositing of the second copper layer and the annealing of the substrate at the third temperature is a second cyclic process that is performed more than once.

12. The method of claim 1, further comprising:
directionally depositing the first copper layer with the dopant with the first dopant content on the substrate, wherein the feature is at least one damascene structure including at least one via and at least one trench; and
annealing the substrate at a second temperature to reflow the first copper layer on the substrate to migrate the dopant in the first copper layer towards the dielectric interface, wherein the at least one via of the damascene structure is completely filled and the at least one trench on the substrate has a portion of the first copper layer on at least one sidewall.

13. The method of claim 12, wherein the first dopant content is approximately 0.5 percent to approximately 10 percent and wherein the second dopant content is zero percent to approximately 0.5 percent.

14. A method of forming an interconnect, comprising:
depositing a first copper layer with a dopant with a first dopant content on at least one trench on a substrate by sputtering a first copper-based target at a first temperature;
annealing the substrate at a second temperature to migrate the dopant in the first copper layer to a sidewall of the at least one trench and to migrate the dopant in the first copper layer into a barrier layer of the at least one trench;
depositing a second copper layer with the dopant with a second dopant content on the at least one trench by sputtering a second copper-based target at the first temperature, wherein the second dopant content is less than the first dopant content; and annealing the substrate at a third temperature to reflow the second copper layer on the substrate to fill the at least one trench, wherein the third temperature is less than or equal to the second temperature.

15. The method of claim 14, wherein the first dopant content is approximately 0.5 percent to approximately 10 percent and wherein the second dopant content is zero percent to approximately 0.5 percent.

16. The method of claim 14, wherein the first temperature is zero degrees Celsius to approximately 200 degrees Celsius, wherein the second temperature is approximately 200 degrees Celsius to approximately 400 degrees Celsius, and wherein the third temperature is approximately 200 degrees Celsius to approximately 400 degrees Celsius.

17. A method of forming an interconnect, comprising:

depositing a metal layer on at least one trench on a substrate by sputtering a metal-based target at a first temperature;

annealing the substrate at a second temperature to reflow the metal layer in the at least one trench and fill at least one via in the at least one trench to improve electro migration of the at least one via and sidewalls of the at least one trench;

etching back the metal layer on the sidewalls of the at least one trench with an isotropic metal etch to allow for additional bulk fill to reduce resistivity of the at least one trench;

depositing a copper layer with a dopant with a dopant content on the at least one trench by sputtering a copper-based target at the first temperature; and annealing the substrate at a third temperature to reflow the copper layer on the substrate to fill the at least one trench, wherein the third temperature is less than or equal to the second temperature.

18. The method of claim 17, wherein the isotropic metal etch uses nitrogen trifluoride gas with oxygen gas or chlorine gas with oxygen gas to etch the metal layer.

19. The method of claim 17, wherein the metal layer is cobalt, ruthenium, tungsten, molybdenum, or copper alloy with a dopant of manganese or wherein the dopant content is zero percent to approximately 0.5 percent.

20. The method of claim 17, wherein the first temperature is zero degrees Celsius to approximately 200 degrees Celsius, wherein the second temperature is approximately 200 degrees Celsius to approximately 400 degrees Celsius, and wherein the third temperature is approximately 200 degrees Celsius to approximately 400 degrees Celsius.

* * * * *